(12) United States Patent
Shimizu et al.

(10) Patent No.: US 6,900,978 B2
(45) Date of Patent: May 31, 2005

(54) CAPACITOR MOUNTING STRUCTURE, CAPACITOR-MOUNTED BOARD, AND WIRING BOARD FOR USE IN CAPACITOR MOUNTING

(75) Inventors: Masayuki Shimizu, Nakamuroda Haruna-Machi (JP); Naoto Yokoyama, Nakamuroda Haruna-Machi (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 10/903,275

(22) Filed: Jul. 30, 2004

(65) Prior Publication Data

US 2005/0024813 A1 Feb. 3, 2005

(30) Foreign Application Priority Data

Jul. 31, 2003 (JP) .......................................... 2003-204849

(51) Int. Cl.[7] .............................. H01G 4/38; H05K 1/16
(52) U.S. Cl. ........................ 361/328; 361/766; 361/782
(58) Field of Search ................................. 361/328–330, 361/763, 766, 782; 174/260–261

(56) References Cited

U.S. PATENT DOCUMENTS

| | | | | |
|---|---|---|---|---|
| 4,930,045 A | * | 5/1990 | Carlson et al. | 361/329 |
| 5,422,782 A | * | 6/1995 | Hernandez et al. | 361/306.2 |
| 5,493,471 A | * | 2/1996 | Walther et al. | 361/328 |
| 2002/0172023 A1 | * | 11/2002 | Blakely et al. | 361/763 |
| 2003/0021096 A1 | * | 1/2003 | Vinson et al. | 361/782 |

* cited by examiner

*Primary Examiner*—Eric Thomas
(74) *Attorney, Agent, or Firm*—Knobbe Martens Olson & Bear LLP

(57) ABSTRACT

A capacitor mounting structure has four capacitors close-arranged so that the outline of the arrangement is almost rectangular. The capacitors are arranged so that an angle formed by the current vectors of each pair of adjacent capacitors is 90 degrees and that one end face in the length direction of each capacitor is directed in parallel to an inner side face of another adjacent capacitor.

20 Claims, 11 Drawing Sheets

Fig. 1 (A) Prior Art
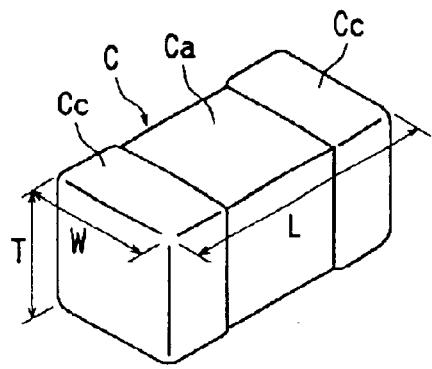
Fig. 1 (B) Prior Art
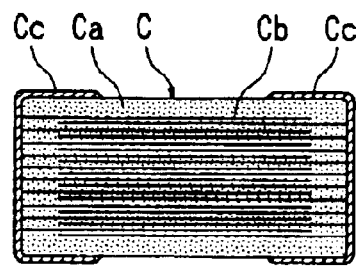
Fig. 2 Prior Art
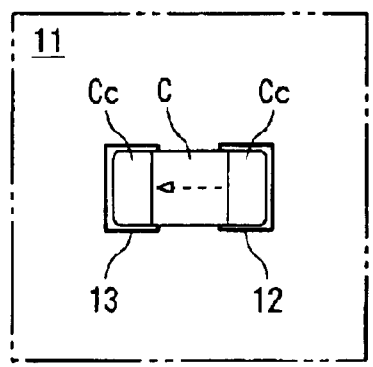
Fig. 3 Prior Art
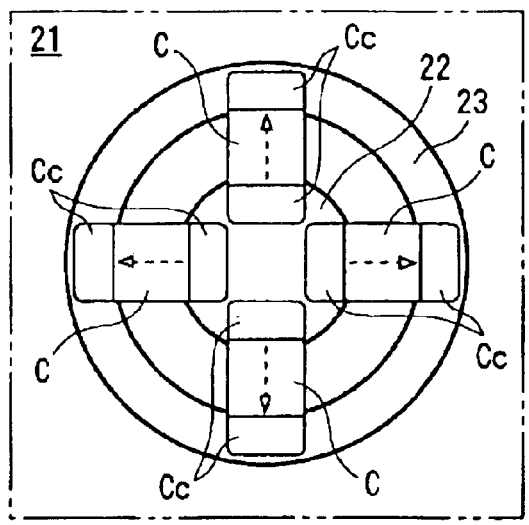

Fig. 1 1 (A)
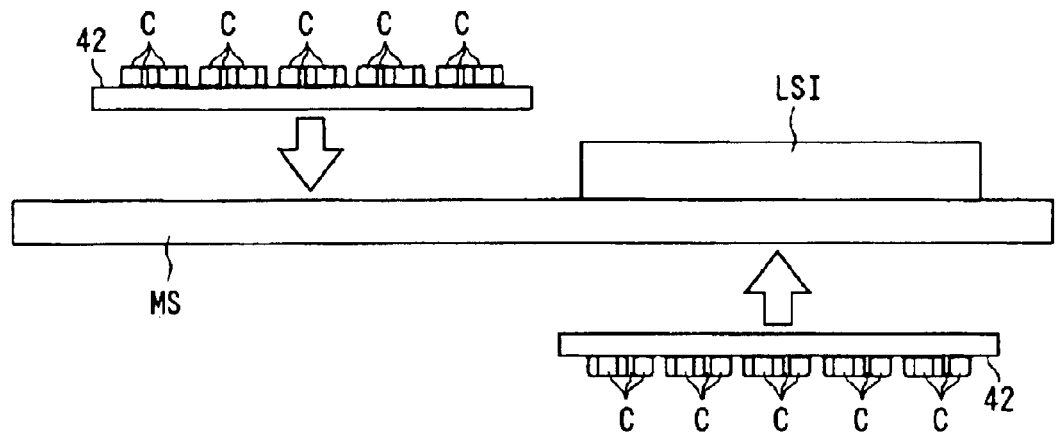
Fig. 1 1 (B)
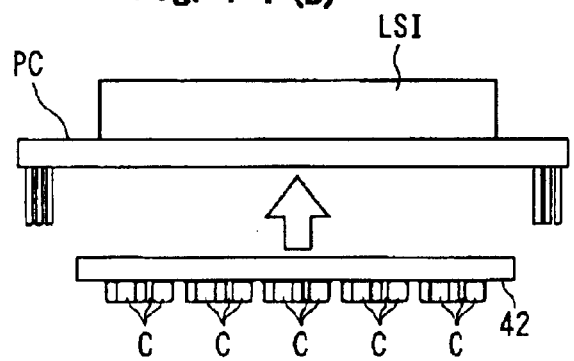
Fig. 1 2
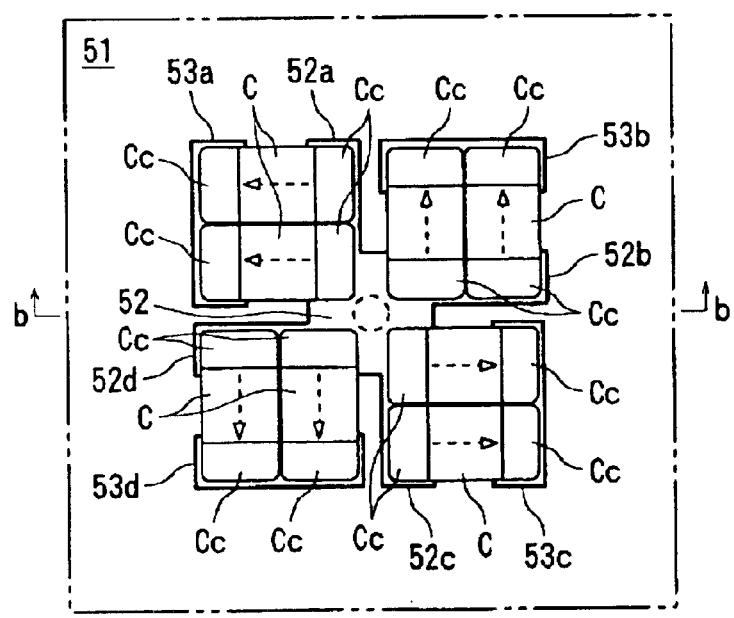

Fig. 1 4 (A)
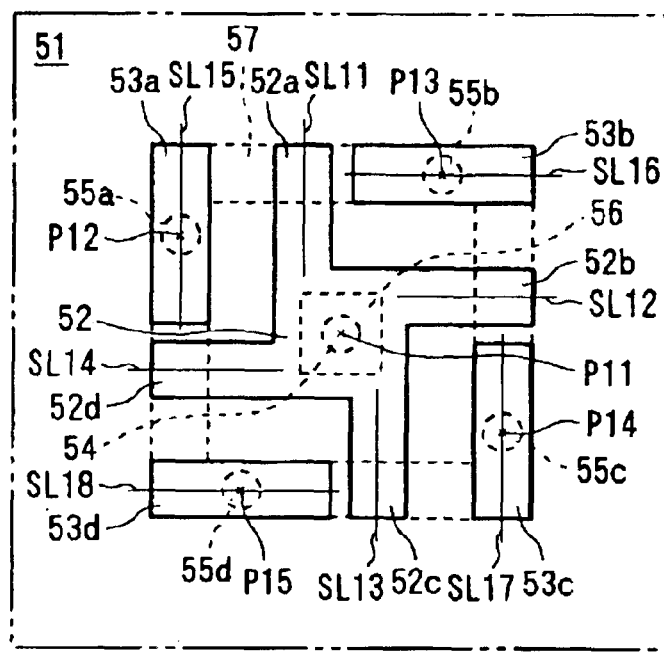
Fig. 1 4 (B)
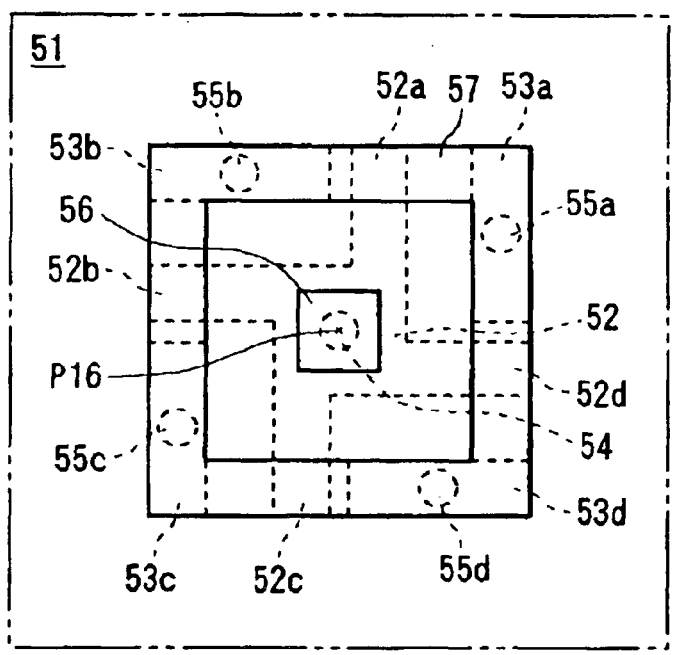

Fig. 1 7 (A)
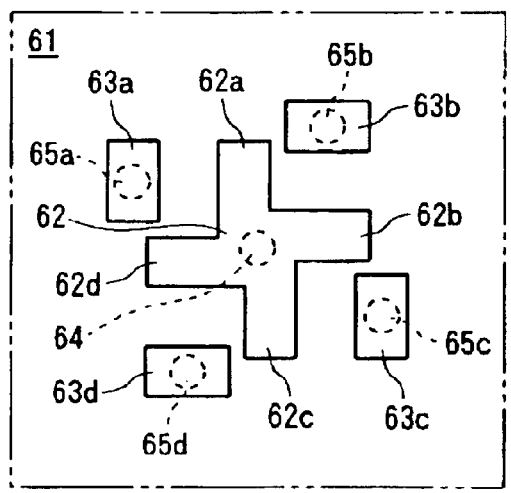
Fig. 1 7 (B)
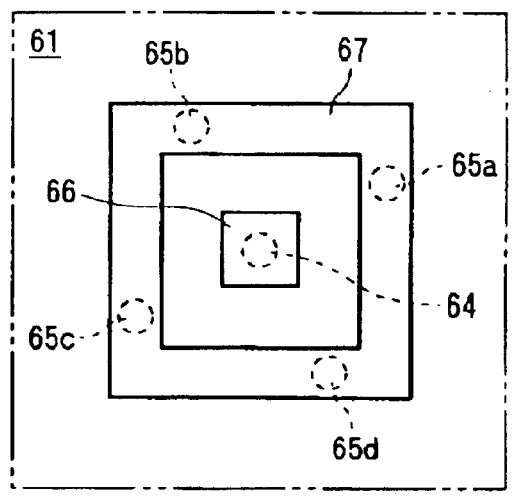
Fig. 1 8
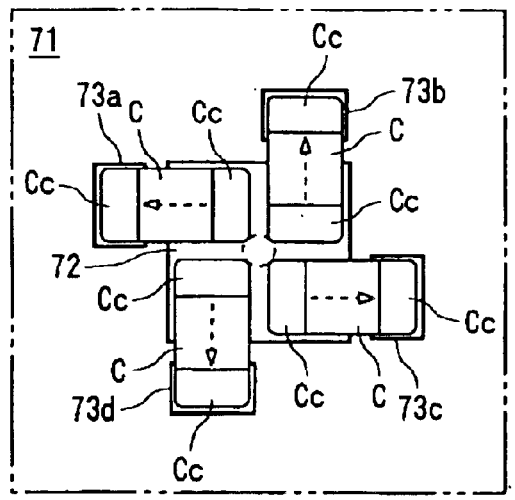

Fig. 2 1 (A)     Fig. 2 1 (B)
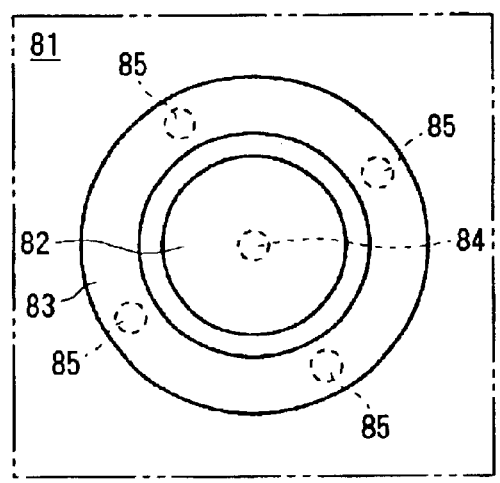
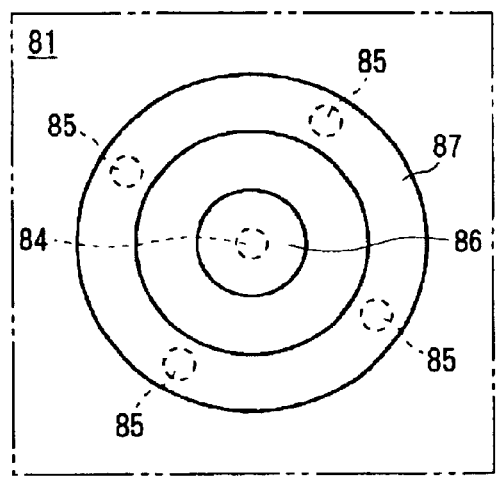

CAPACITOR MOUNTING STRUCTURE, CAPACITOR-MOUNTED BOARD, AND WIRING BOARD FOR USE IN CAPACITOR MOUNTING

This is a U.S. patent application claiming foreign priority under 35 U.S.C. § 119 to Japanese Patent Application No. 2003-204849, filed Jul. 31, 2003, the disclosure of which is herein incorporated by reference in their entirety.

BACKGROUND OF THE INVENTION

1. Field of the Invention

The present invention relates to a capacitor mounting structure useful for a reduction in equivalent series inductance, a capacitor-mounted board formed by arranging capacitor mounting structures of the above type in parallel, and a wiring board on which capacitors are to be mounted.

2. Description of the Related Art

FIG. 1A is a perspective view showing a monolithic ceramic capacitor (hereinafter simply referred to as a "capacitor") C, and FIG. 1B is a longitudinal sectional view showing the capacitor C shown in FIG. 1A.

The overall form of the capacitor C in FIG. 1A is a parallelepiped rectangle. The length L, width W, and thickness T of the capacitor C have the relationship $$L > W = T$$

when the length L, the width W, and the thickness T are standard values. The sizes of capacitors of the above type are given common names, such as "0603", "1005", etc. For example, a capacitor C called "0603" has a standard length L of 0.6 mm and a standard width W and thickness T of 0.3 mm.

This capacitor C consists of a parallelepiped ceramic chip Ca having a relationship represented by $L > W = T$ (when L, W, and T are standard values), a large number of internal electrodes Cb which are embedded at regular intervals in the thickness direction and whose edges in the length direction are alternately exposed on opposite side surfaces in the length direction of the ceramic chip Ca, and external electrodes Cc which cover the opposite side surfaces in the length direction of the ceramic chip Ca and their peripheries, and which are formed by a single or plural layers in conduction to the exposed ends of the internal electrodes Cb.

The capacitor C serves an important role as a noise suppressing component in various electronic circuits. For example, around a large-scale integrated circuit (LSI) such as a central processing unit (CPU), a plurality of bypass capacitors are mounted in order to achieve stable operation by eliminating noise caused by power-supply switching, etc.

The capacitor C is treated as a component having a predetermined capacitance. An equivalent circuit of a capacitor has frequency characteristics similar to those of a series resonant circuit because the equivalent circuit has not only a capacitance but also an equivalent series inductance (hereinafter referred to as an "ESL") and an equivalent series resistance (hereinafter referred to as an "ESR").

In other words, as shown in the capacitor mounting structure shown in FIG. 2, when considering a state in which one external electrode Cc is connected to a signal electrode 12 on a board 11 and in which a current flows in the direction indicated by the broken line arrow in a capacitor C connected to the other external electrode Cc, it is difficult for a frequency range where the current frequency is lower than a resonant frequency to be affected by an ESL, and a frequency range where the current frequency is higher than the resonant frequency is easily affected by the ESL. Thus, the impedance increases substantially in proportion to an increase in frequency.

To improve the above frequency characteristics, the resonant frequency must be increased by reducing the capacitance, or the ESL must be reduced. However, a reduction in capacitance increases the impedance, so that the desired aim of noise elimination cannot be achieved. Accordingly, recently, methods in which the ESL is reduced by improving the arrangement of capacitors have been proposed.

FIG. 3 shows a capacitor mounting structure illustrating one example (see, for example, Japanese Unexamined Patent Application Publication No. 2001-23849) of the above methods. This structure includes a board 21, a circular signal electrode 22, a ring ground electrode 23 provided around the signal electrode 22, and a total of four capacitors C. The four capacitors C are disposed in a cross form. One external electrode Cc of each capacitor C is connected to the signal electrode 22, and the other signal electrode Cc thereof is connected to the ground electrode 23.

In this capacitor mounting structure, current flows in the same direction (indicated by the broken line arrow shown in FIG. 3) in each of the capacitors C disposed in the cross form, and the current vectors of each pair of two adjacent capacitors C have an angle of 90 degrees therebetween. This minimizes the mutual inductance which can be generated between each pair of adjacent capacitors C, thus reducing the ESL of the entire mounting structure.

With demands for improvements in function and performance of electronic devices such as personal computers and cellular phones, there are still strongly demands for internal electronic circuits with high packaging density. In addition, in the case of electronic circuits that treat various signal systems, such as LSIs used as CPUs, a large number of capacitors must be mounted in accordance with the signal systems.

However, in the capacitor mounting structure shown in FIG. 3, two adjacent capacitors C, which form each pair, have a sector-form dead-space region since the ground electrode 23 is circular and the four capacitors C are arranged in the cross form. In other words, in the case of arranging in parallel capacitor mounting structures of the type shown in FIG. 3 in order to mount many capacitors C, the dead space increases as the number of capacitor mounting structures increases, so that an increase in the area required for mounting cannot satisfy demands for increased packaging density.

SUMMARY OF THE INVENTION

The present invention has been made in view of the above circumstances. In an aspect, an object of the present invention is to provide a capacitor mounting structure which has a reduced ESL and in which demands for increased packaging density are satisfied by a reduced mounting area. In another aspect, an object of the present invention is to provide a capacitor-mounted board on which capacitor mounting structures of the above are arranged in parallel. In still another aspect, an object of the present invention is to provide a wiring board on which capacitors are to be mounted.

According to an embodiment of the first aspect of the present invention, a capacitor mounting structure is provided which includes four capacitors or multiples-of-four capacitors whose quantity is represented by N times four, where N is an integer of 1 or greater, the N times four capacitors (N≧1) each having external electrodes at ends in the length direction and each being parallelepiped in a rectangle, and signal electrodes and ground electrodes to which the N times four capacitors are connected in parallel. Among the N times four capacitors, a first group of the capacitors, which is a first quarter of the capacitors, is provided in a predetermined direction; a second group of the capacitors, which is a second quarter of the capacitors, is provided so that an angle formed by a current vector of the second group of the capacitors and a current vector of the first group of the capacitors is nearly or substantially 90 degrees; a third group of the capacitors, which is a third quarter of the capacitors, is provided so that an angle formed by a current vector of the third group of the capacitors and a current vector of the second group of the capacitors is nearly or substantially 90 degrees; and a fourth group of the capacitors, which is a fourth quarter (the remaining quarter) of the capacitors, is provided so that an angle formed by a current vector of the fourth group of the capacitors and a current vector of the third group of the capacitors is nearly or substantially 90 degrees.

In the above, one of the first group, one of the second group, one of the third group, and one of the fourth group constitute a set of capacitors. One or more sets of capacitors can be used.

In addition, preferably, in a set of capacitors, one end face of the first group of the capacitors in the length direction thereof is nearly or substantially parallel to an inner side face of the fourth group of the capacitors, one end face of the second group of the capacitors in the length direction thereof is nearly or substantially parallel to an inner side face of the first group of the capacitors, one end face of the third group of the capacitors in the length direction thereof is nearly or substantially parallel to an inner side face of the second group of the capacitors, and one end face of the fourth group of the capacitors in the length direction thereof is nearly or substantially parallel to an inner side face of the third group of the capacitors. Further, in an embodiment, in a set of capacitors, the one end face of the first group of the capacitors faces the inner side face of the fourth group of the capacitors, the one end face of the second group of the capacitors faces the inner side face of the first group of the capacitors, the one end face of the third group of the capacitors faces the inner side face of the second group of the capacitors, and the one end face of the fourth group of the capacitors faces the inner side face of the third group of the capacitors.

According to an embodiment of the second aspect of the present invention, a capacitor-mounted board is provided which includes a plurality of capacitor mounting structures of any of the above. The capacitor mounting structures may be arranged in parallel.

According to an embodiment of the third aspect of the present invention, a wiring board for use in capacitor mounting is provided which has combinations of signal electrodes and ground electrodes to which four capacitors or multiples-of-four capacitors whose quantity is represented by N times four, where N represents an integer of 1 or greater, are connectable in parallel. The N times four capacitors (N≧1) may each have external electrodes at ends at the length direction and each may be parallelepiped in a rectangle. The signal electrodes and the ground electrodes may be arranged in such a way that, among the N times four capacitors whose number is represented by N times four (N≧1), a first group of the capacitors, which is a first quarter of the capacitors, is provided in a predetermined direction; a second group of the capacitors, which is a second quarter of the capacitors, is provided so that an angle formed by a current vector of the second group of the capacitors and a current vector of the first group of the capacitors is nearly or substantially 90 degrees; a third group of the capacitors, which is a third quarter of the capacitors, is provided so that an angle formed by a current vector of the third group of the capacitors and a current vector of the second group of the capacitors is nearly or substantially 90 degrees; and a fourth group of the capacitors, which is a fourth quarter (the remaining quarter) of the capacitors, is provided so that an angle formed by a current vector of the fourth group of the capacitors and a current vector of the third group of the capacitors is nearly or substantially 90 degrees, and so that one end face of the first group of the capacitors in the length direction thereof is nearly or substantially parallel to an inner side face of the fourth group of the capacitors, one end face of the second group of the capacitors in the length direction thereof is nearly or substantially parallel to an inner side face of the first group of the capacitors, one end face of the third group of the capacitors in the length direction thereof is nearly or substantially parallel to an inner side face of the second group of the capacitors, and one end face of the fourth group of the capacitors in the length direction thereof is nearly or substantially parallel to an inner side face of the third group of the capacitors. A set of capacitors may be comprised of one of the first group, one of the second group, one of the third group, and one of the fourth group.

According to the present invention, in one or more embodiments, a capacitor mounting structure in which an ESL can be reduced and demands for increased packaging density can be satisfied by a reduced mounting area, a capacitor-mounted board on which capacitor mounting structures of the above can be arranged in parallel, and a wiring board on which capacitors are to be mounted are provided.

In all of the foregoing embodiments, any element used in an embodiment can interchangeably be used in another embodiment, and any combination of elements can be applied in these embodiments, unless it is not feasible.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further objects, features and advantages of the present invention will become apparent from the following description of the preferred embodiments with reference to the attached drawings.

BRIEF DESCRIPTION OF THE DRAWINGS

These and other features of this invention will now be described with reference to the drawings of preferred embodiments which are intended to illustrate and not to limit the invention.

FIGS. 1A and 1B are a perspective view and longitudinal sectional view of a monolithic ceramic capacitor.

FIG. 2 is an illustration of a capacitor mounting structure formed by mounting a capacitor on a board.

FIG. 3 is an illustration of a capacitor mounting structure formed by mounting four capacitors in a cross form.

FIGS. 11A and 11B are sectional views showing an application of the capacitor-mounted board shown in FIG. 10.

FIG. 12 is a top plan view showing another example of the capacitor mounting structure to which the present invention is applied.

FIG. 14A is a plan view showing a surface signal electrode and surface ground electrodes in the capacitor mounting structure shown in FIG. 12.

FIG. 14B is a plan view showing a reverse face signal electrode and reverse face ground electrode in the capacitor mounting structure shown in FIG. 12.

FIG. 17A is a plan view showing a surface signal electrode and surface ground electrodes in the capacitor mounting structure shown in FIG. 16.

FIG. 17B is a plan view showing a reverse face signal electrode and reverse face ground electrodes in the capacitor mounting structure shown in FIG. 16.

FIG. 18 is a plan view showing the surface of another example of the capacitor mounting structure to which the present invention is applied.

FIG. 21A is a plan view showing a surface signal electrode and surface ground electrodes in the capacitor mounting structure shown in FIG. 20.

FIG. 21B is a plan view showing a reverse face signal electrode and a reverse face ground electrode.

DESCRIPTION OF THE PREFERRED EMBODIMENTS

As explained above, the present invention can be accomplished in various ways including, but not limited to, the foregoing embodiments. The present invention will be explained in detail with reference to the drawings, but the present invention should not be limited thereto.

Embodiments of the present invention are described below.

Figure 4:
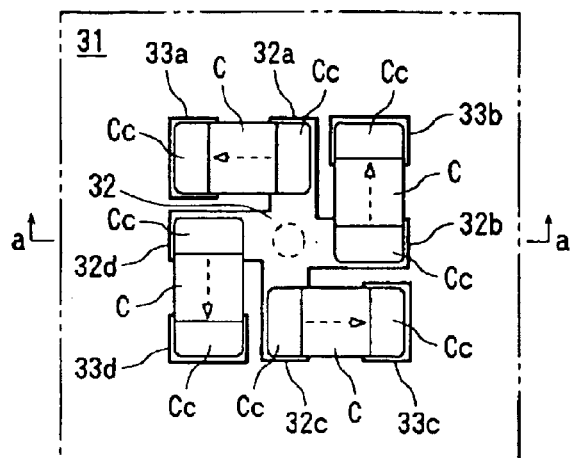
FIG. 4 is a top plan view showing an example of a capacitor mounting structure to which the present invention is applied.
Figure 5:
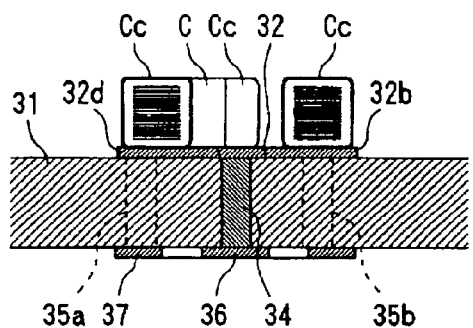
FIG. 5 is a cross sectional view taken on the line V—V shown in FIG. 4.
Figure 6:
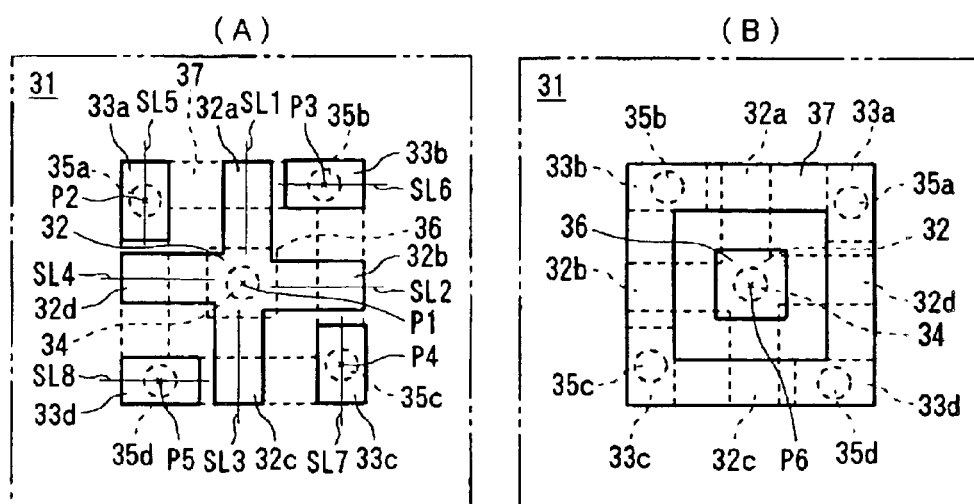
FIG. 6A is a plan view showing a surface electrode and a surface ground electrode in the capacitor mounting structure shown in FIG. 4.
FIG. 6B is a plan view showing a reverse face signal electrode and a reverse face ground electrode.

FIG. 4 is a top plan view showing an example of a capacitor mounting structure to which the present invention is applied. FIG. 5 is a cross sectional view taken on the line V—V shown in FIG. 4. FIG. 6A shows a surface signal electrode and surface ground electrodes in the capacitor mounting structure shown in FIG. 4, and FIG. 6B shows a reverse face signal electrode and a reverse face signal electrode in the capacitor mounting structure shown in FIG. 4. FIGS. 6A and 6B show a board 31, a surface signal electrode 32, surface ground electrodes 33a to 33d, through-holes 35a to 35d, a reverse face signal electrode 36, and a reverse face ground electrode 37. A description of the capacitors C shown in FIG. 4 is omitted since each of them is identical to that shown in FIGS. 1A and 1B.

The board 31 is made of an insulating material, such as ceramic or plastic, and has a predetermined thickness.

As shown in FIG. 6A, the surface signal electrode 32 is almost cross-shaped and is made of conductive material such as metal. The surface signal electrode 32 has four branching electrodes 32a to 32d extending outward from its center, with approximately 90 degrees formed between one branching electrode and another branching electrode. Each of the branching electrodes 32a to 32d has a rectangular shape having a predetermined width. The distances from the center P1 of the surface signal electrode 32 to outer edges of the branching electrodes 32a to 32d are approximately equal. Center lines SL1 to SL4 in the width direction (hereinafter referred to as "width-center lines SL1 to SL4") of the branching electrodes 32a to 32d do not cross the center P1 of the surface signal electrode 32, but are shifted in parallel from the center P1 to right by the same distance.

Each of the surface ground electrodes 33a to 33d has a predetermined width and a predetermined length, as shown in FIG. 6A, and is formed of conductive material such as metal. The distances from the centers P2 to P5 of the surface ground electrodes 33a to 33d to the center P1 of the branching electrodes 32a to 32d are approximately equal. The width-center line SL5 of the surface ground electrode 33a is parallel to the width-center line SL1 of the branching electrode 32a. The width-center line SL6 of the surface ground electrode 33b is parallel to the width-center line SL2 of the branching electrode 32b. The width-center line SL7 of the surface ground electrode 33c is parallel to the width-center line SL3 of the branching electrode 32c. The width-center line SL8 of the surface ground electrode 33d is parallel to the width-center line SL4 of the branching electrode 32d. An outer edge of the branching electrode 32a, an outer side in the length direction of the surface ground electrode 33a, and an outer side in the width direction of the surface ground electrode 33b are almost colinear. An outer edge of the branching electrode 32b, an outer side in the length direction of the surface ground electrode 33b, and an outer side in the width direction of the surface ground electrode 33C are almost colinear. An outer edge of the branching electrode 32c, an outer side in the length direction of the surface ground electrode 33c, and an outer side in the width direction of the surface ground electrode 33d are almost colinear. An outer edge of the branching electrode 32d, an outer side in the length direction of the surface ground electrode 33d, and an outer side in the width direction of the surface ground electrode 33a are almost colinear. In addition, the distance between the surface ground electrode 33a and the branching electrode 32a, the distance between the surface ground electrode 33b and the branching electrode 32b, the distance between the surface ground electrode 33c and the branching electrode 32c, the distance between the surface ground electrode 33d and the branching electrode 32d are approximately equal. The distance between the surface ground electrode 33a and the branching electrode 32a, the distance between the surface ground electrode 33b and the branching electrode 32b, the distance between the surface ground electrode 33c and the branching electrode 32b, and the distance between the surface ground electrode 33d and the branching electrode 32c are approximately equal.

The throughhole 34 is cylindrical and formed of conductive material such as metal. The throughhole 34 is formed through the board 31 under the center P1 of the branching electrode 32. The throughholes 35a to 35d are cylindrical and formed of conductive metal such as metal. The throughholes 35a to 35d are formed through the board 31 under the centers P2 to P5 of the surface ground electrodes 33a to 33d. The throughholes 34 and 35a to 35d do not always need to be cylindrical, but may be cylindrically formed by forming a metal film on the inner wall of a throughhole. Also the positions of the throughholes 34 and 35a to 35d may be shifted from under the centers P1 to P5.

As shown in FIG. 6B, the reverse face signal electrode 36 is rectangular and is formed of conductive material such as metal. The reverse face signal electrode 36 is formed so that its center P6 approximately aligns with the center P1 of the surface signal electrode 32 in a reverse face view. The reverse face signal electrode 36 is in conduction with the surface signal electrode 32 through the throughhole 34.

As shown in FIG. 6B, the reverse face ground electrode 37 is rectangular and is formed of conductive material such as metal. The width of the reverse face ground electrode 37 is approximately equal to the width of each of the surface ground electrodes 33a to 33d. In the reverse face view, the outer edges of the reverse face ground electrode 37 approximately correspond to outer sides in the width direction of the surface ground electrodes 33a to 33d, and the inner edges of the reverse face ground electrode 37 approximately correspond to inner sides in the width direction of the surface ground electrodes 33a to 33d. The reverse face ground electrode 37 is in conduction with the surface ground electrodes 33a to 33d through the four throughholes 35a to 35d.

Four capacitors C are mounted on the branching electrodes 32a to 32d of the surface signal electrode 32 and the surface ground electrodes 33a to 33d by soldering or the like. Specifically, among the four capacitors C, one capacitor C has one external electrode Cc connected to the surface signal electrode 32a and the other external electrode Cc connected to the surface ground electrode 33a. Another capacitor C has one external electrode Cc connected to the branching electrode 32b, and the other external electrode Cc connected to the surface ground electrode 33b. A further capacitor C has one external electrode Cc connected to the branching electrode 32c and the other external electrode Cc connected to the surface ground electrode 33c. Still another capacitor C has one external electrode Cc connected to the branching electrode 32d, and the other external electrode Cc connected to the surface ground electrode 33d. In other words, the four mounted capacitors C have a state in which they are connected in parallel, so that the directions of currents flowing in them are as indicated by the broken line arrows shown in FIG. 4.

More specifically, among the four mounted capacitors C, an angle formed by the current vectors of the top left capacitor C in FIG. 4 and the bottom left capacitor C in FIG. 4 is approximately 90 degrees. An angle formed by the current vectors of the bottom left capacitor C in FIG. 4 and the bottom right capacitor C is approximately 90 degrees. An angle formed by the current vectors of the bottom right capacitor C and the top right capacitor C is approximately 90 degrees. An angle formed by the current vectors of the top right capacitor C and the top left capacitor C is approximately 90 degrees. A right end face in the length direction of the top left capacitor C in FIG. 4 is directed almost in parallel to an outer portion of an inner side face of the top right capacitor C in FIG. 4, with a minute distance provided therebetween. An upper end face in the length direction of the bottom left capacitor C is directed almost in parallel to an outer portion of an inner side face of the top left capacitor C in FIG. 4, with a minute distance provided therebetween. A left end face in the length direction of the bottom right capacitor C in FIG. 4 is directed almost in parallel to an outer portion of an inner side face of the bottom left capacitor C in FIG. 4. An end face in the length direction of the top right capacitor C in FIG. 4 is directed almost in parallel to an outer portion of an inner side face of the capacitor C, with a minute distance provided therebetween.

In the above capacitor mounting structure, the current vectors of each pair of adjacent capacitors C have an angle of approximately 90 degrees (ideally 90 degrees) therebetween. This minimizes the mutual inductance which can be generated between the adjacent capacitors C, thus reducing the ESL of the entire mounting structure.

In the above capacitor mounting structure, the branching electrodes 32a to 32d of the surface signal electrode 32 are positioned very close to the capacitors C. In addition, the width-center lines SL1 to SL4 of the branching electrodes 32a to 32d are positioned almost in parallel to the current vectors of the capacitors C. The branching electrodes 32a to 32d serve to reduce inductance by blocking magnetic flux generated when currents flow in the capacitors C. Thus, the ESL of the entire mounting structure can be considerably reduced. Obviously, one external electrode Cc of one adjacent capacitor C, which is directed to the inner side face of each capacitor C, can also have an inductance reducing operation as described above.

Figure 7:
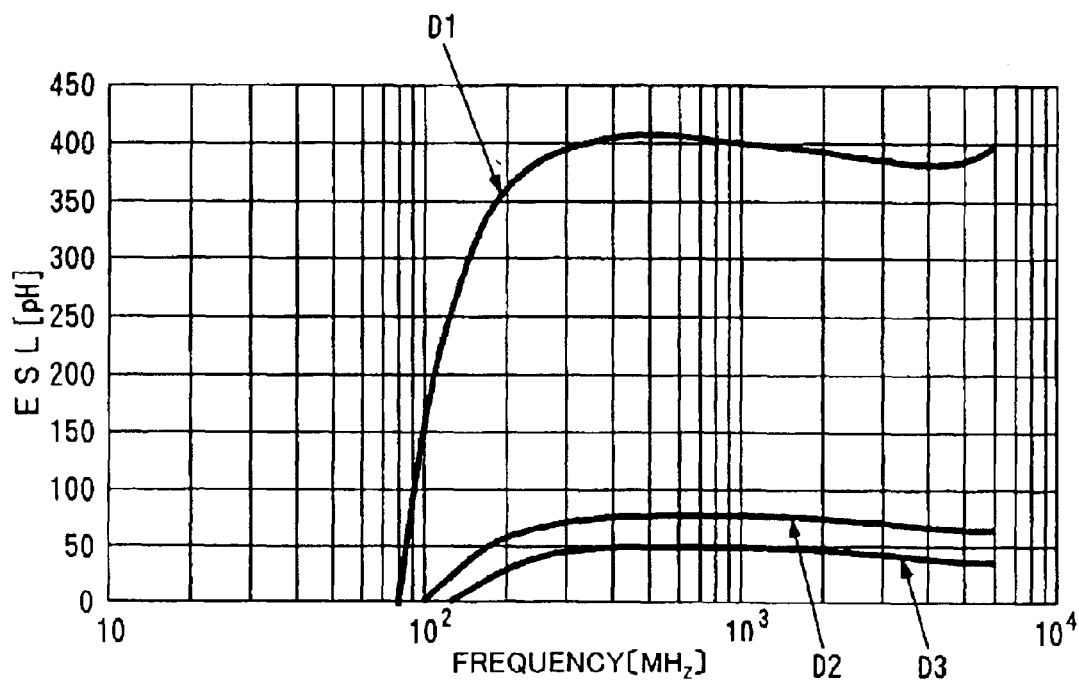
FIG. 7 is a graph showing relationships between frequency and ESL in the capacitor mounting structures shown in FIGS. 2, 3, and 4.

FIG. 7 is a graph showing relationships between frequency [MHz] and ESL [pH] in the capacitor mounting structure shown in FIGS. 2, 3, and 4. FIG. 7 shows a change D1 in ESL in the capacitor mounting structure shown in FIG. 2, a change D2 in ESL in the capacitor mounting structure shown in FIG. 3, and a change D3 in ESL in the capacitor mounting structure shown in FIG. 4. Capacitors C used in data measurement were of the type "0603". In the capacitor mounting structure in FIG. 2, a capacitor having a capacitance of 0.1 $\mu$F was used as a capacitor C. In the capacitor mounting structures in FIGS. 3 and 4, capacitors having a total capacitance of 0.1 $\mu$F were used.

As is clear from FIG. 7, compared with the capacitor mounting structures shown in FIGS. 2 and 3, in the capacitor mounting structure in FIG. 4, the ESL is reduced over the measured frequency range. The ESL at a frequency of 103 MHz (1 GHz) is approximately 400 pH in the capacitor mounting structure in FIG. 2, is approximately 75 pH in the capacitor mounting structure in FIG. 3, and is approximately 50 pH in the capacitor mounting structure in FIG. 4. The capacitor mounting structure in FIG. 4 enables an approximately 33-percent reduction of ESL compared with the capacitor mounting structure in FIG. 3.

Figure 15:
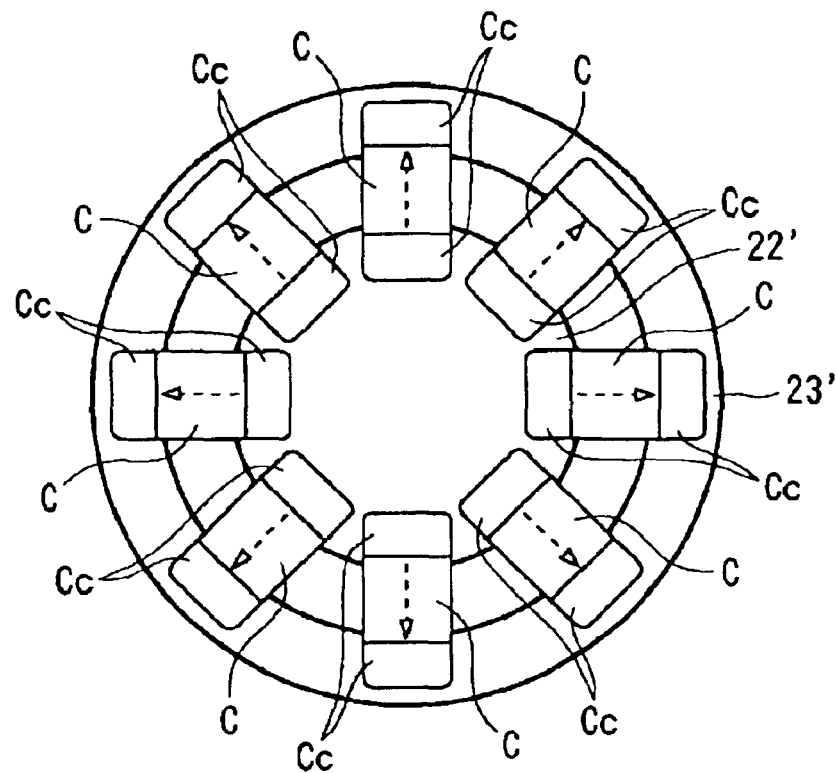
FIG. 15 is a plan view showing a comparative example in which eight capacitors C are radially disposed by using the idea of the capacitor mounting structure shown in FIG. 3.

In addition, in the above capacitor mounting structure, between two adjacent capacitors C, which forms each pair, there is not a sector-form dead-space region as in the capacitor mounting structure shown in FIG. 15. Moreover, four capacitors C can be close arranged so that the outline of the arrangement is almost rectangular. Thus, a mounting area in which the capacitors C are disposed is roughly represented by $$[\text{Length of Capacitor C} + \text{Width of Capacitor C} + \alpha(\text{Minute Gap between Capacitors})]^2$$

Specifically, in the case of forming the capacitor mounting structure shown in FIG. 3 by using "0603" capacitors C, the minimum mounting area is approximately 1.8 mm$^2$. In addition, in the case of forming the capacitor mounting structure shown in FIG. 4 by using "0603" capacitors C, the minimum mounting area is approximately 0.9 mm$^2$. Accordingly, the capacitor mounting structure in FIG. 4 enables an approximately 50-percent reduction of mounting area compared with the capacitor mounting structure in FIG. 3.

Therefore, in the case of mounting many capacitors C, by arranging in parallel capacitor mounting structures as shown in FIG. 4, dead-space regions are prevented from increasing in accordance with an increase in number of capacitor mounting structures as shown in FIG. 4. This satisfies demands for increased packaging density by reducing the required mounting area.

Figure 8:
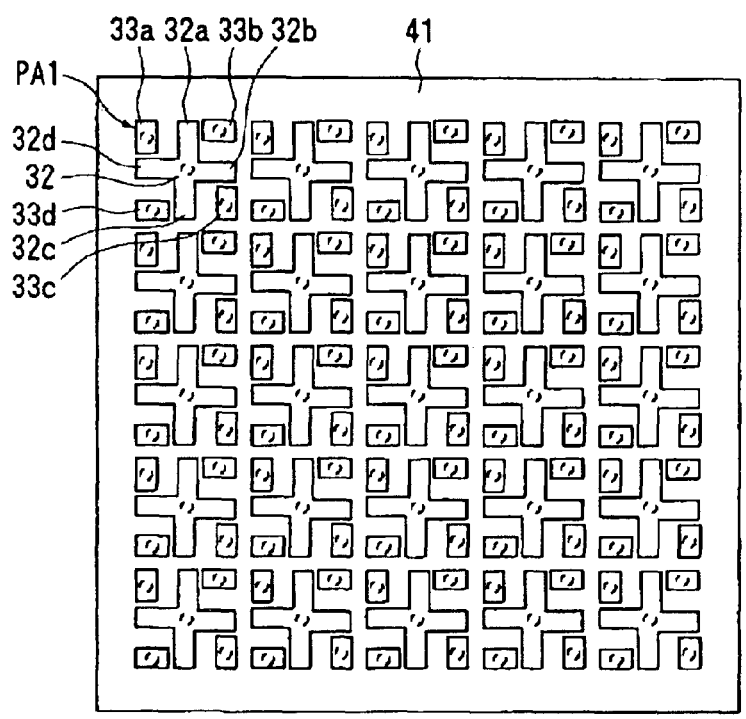
FIG. 8 is a plan view showing the surface of a wiring board for use in arranging in parallel capacitor mounting structures as shown in FIG. 4.
Figure 9:
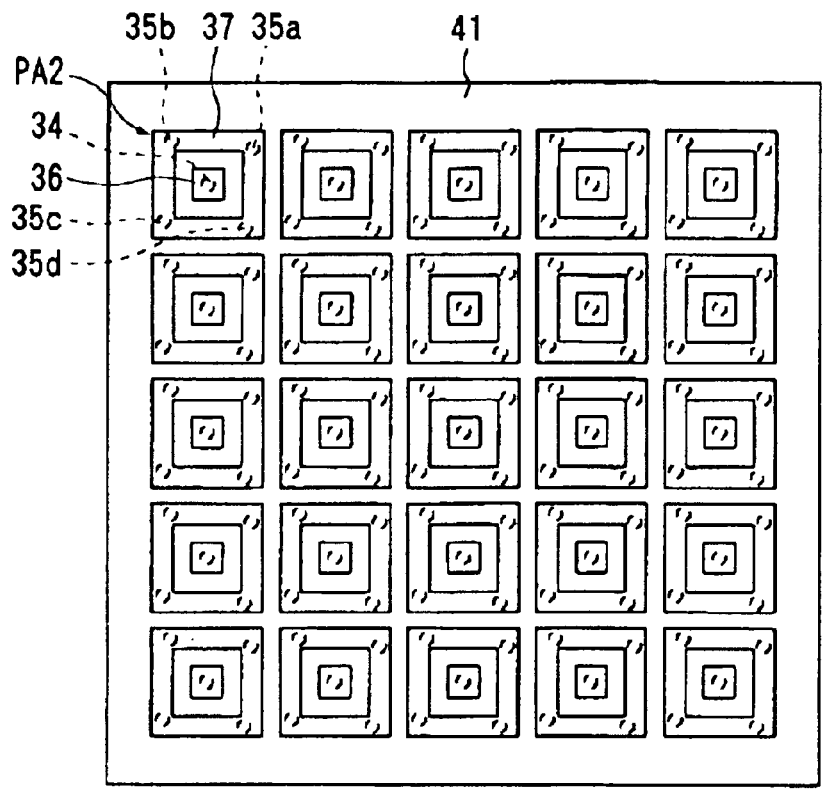
FIG. 9 is a plan view showing the reverse face of the wiring board shown in FIG. 8.

FIG. 8 is a plan view showing the surface of a wiring board for use in arranging in parallel capacitor mounting structures as shown in FIG. 4. FIG. 9 is a plan view showing the reverse face of the wiring board shown in FIG. 8.

On the surface of a wiring board 41, 25 unit surface electrodes PA1 are formed in a matrix of five rows and five columns. Each unit surface electrode PA1 is constituted by the surface signal electrode 32 and four surface ground electrodes 33a to 33d as shown in FIG. 6A. On the reverse face of the wiring board 41, 25 unit surface electrodes PA2 are formed in an arrangement corresponding to the arrangement of the unit surface electrodes PA1. Each unit surface electrode PA1 is constituted by a reverse face signal electrode 36 and a reverse face ground electrode 37 as shown in FIG. 6B. 25 sets of the throughhole 34 and 35a to 35d, which connect the unit surface electrodes PA1 and the unit surface electrodes PA2, are formed. The mutual gap between two adjacent unit surface electrodes PA1 is controlled to be the minimum at which, in a state with the capacitors C mounted, each mounted capacitor C does not interfere with each unit surface electrode PA1. For example, the mutual gap in the case of using "0603" capacitors C is controlled to be approximately 0.15 mm.

The wiring board 41 shown in FIGS. 8 and 9 can be formed by a known wiring board forming method, if needed. For example, by using photo-etching, unit surface electrodes PA1 and unit surface electrodes PA2, which are made of copper, are formed in a matrix of five rows and five columns on the surface and reverse face of a board which is formed of dielectric material, such as alumina, and has a predetermined size. Next, throughholes are formed at throughhole forming positions by a technique such as laser beam machining or drilling, and the inner walls of the throughholes are plated with copper or the like to form the throughholes 34 and 35a to 35d. Finally, exposed faces of the unit surface electrodes PA1 and the unit surface electrodes PA2 are plated with gold or like, and soldering paste is printed on the plated faces. In addition, soldering resist is formed on the surface and reverse face of the board, if needed.

Figure 10:
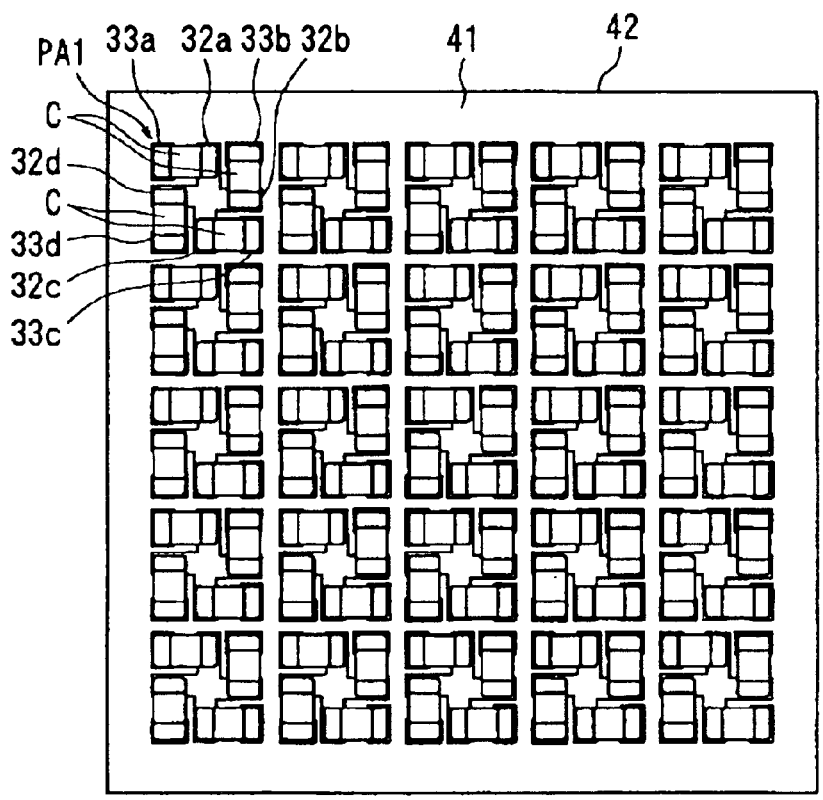
FIG. 10 is a plan view showing the surface of a capacitor-mounted board obtained by mounting the required number of capacitors on the surface of the wiring board shown in FIGS. 8 and 9.

FIG. 10 is a plan view showing the surface of a capacitor-mounted board 42 obtained by mounting the required number of capacitors C on the surface of the wiring board 41 shown in FIGS. 8 and 9.

The capacitor-mounted board 42 can be formed by mounting four capacitors C on each surface electrode PA1 on the wiring board 41, putting the capacitor-mounted board into a reflow oven, and soldering the capacitors C. In this case, because each of the unit surface electrodes PA1 arranged in a matrix of five rows and five columns has four capacitors C mounted thereon, the total of the mounted capacitors C is 100. However, the dead-space regions of the unit surface electrodes PA1 themselves are small, and, in addition, each mutual gap between one and another of the unit surface electrodes PA1 can be reduced as much as possible. Thus, the area required for mounting one hundred capacitors C is reduced, which greatly contribute in increased packaging density.

As FIG. 11A shows, the capacitor-mounted board 42 in FIG. 10 can be mounted on a main board MS such that the unit surface electrodes PA2 in a matrix of five rows and five columns on the reverse face of the capacitor-mounted board 42 are connected to corresponding electrodes (not shown) formed on the surface or reverse face of the main board MS. As FIG. 11B shows, the capacitor-mounted board 42 in FIG. 10 can be mounted on an LSI package PC such that the unit surface electrodes PA2 in a matrix of five rows and five columns on the reverse face of the capacitor-mounted board 42 are connected to corresponding electrodes (not shown) formed on the reverse face of the LSI package PC.

By forming extraction electrodes which serve as the arrangement of unit surface electrodes PA1, throughholes, and unit surface electrodes PA2 as shown in FIG. 8, the capacitors C can be directly mounted on the surface or reverse face of the main board MS. In addition, by forming extraction electrodes which serve as the arrangement of unit surface electrodes PA1, throughholes, and unit surface electrodes PA2 as shown in FIG. 8, the capacitors C can be directly mounted on the reverse face of the LSI package PC.

FIGS. 8 and 9 show the wiring board 41 in which a matrix of five rows and five columns is used to form a total of 25 unit surface electrodes PA1 and a total of 25 unit surface electrodes PA2. However, it is obvious that the number of arranged unit surface electrodes PA1 and the number of arranged unit surface electrodes PA2 may be arbitrarily changed in accordance with the size of the wiring board 41 or the size of each capacitor C for use.

Figure 13:
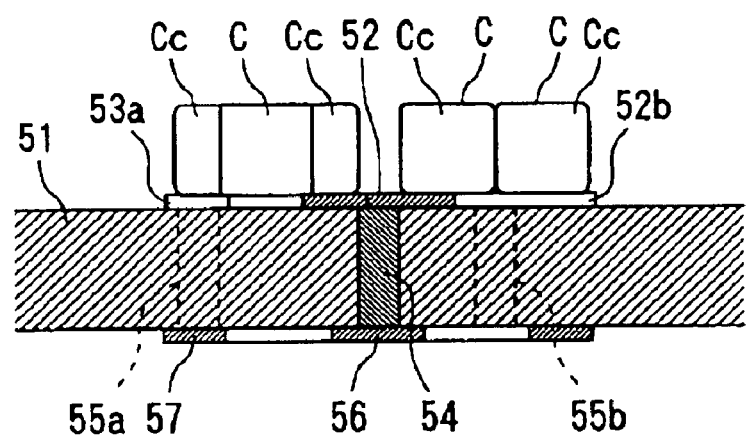
FIG. 13 is a cross sectional view taken on the line XIII—XIII shown in FIG. 12.

FIG. 12 is a top plan view showing another example of the capacitor mounting structure to which the present invention is applied. FIG. 13 is a cross sectional view taken on the line XIII—XIII shown in FIG. 12. FIG. 14A shows a surface signal electrode and surface ground electrodes in the capacitor mounting structure shown in FIG. 12, and FIG. 14B shows a reverse face signal electrode and reverse face ground electrodes in the capacitor mounting structure shown in FIG. 12. FIGS. 12, 13, 14A, and 14B show a board 51, a surface signal electrode 52, surface ground electrodes 53a to 53d, throughholes 54 and 55a to 55d, a reverse face signal electrode 56, and a reverse face ground electrode 57. A description of each capacitor C shown in FIGS. 12, 13, 14A, and 14B is omitted since the capacitor C is identical to that shown in FIGS. 1A and 1B.

The board 51 is formed of insulating material such as ceramic or plastic, and has a predetermined thickness.

As shown in FIG. 14A, the surface signal electrode 52 is cross-shaped and is formed of conductive material such as metal. The surface signal electrode 52 has four branching electrodes 52a to 52d extending outward from the center, with approximately 90 degrees formed between each pair of surface signal electrodes. Each of the branching electrodes 52a to 52d is rectangular and has a predetermined width. The distances from the center P11 of the surface signal electrode 52 to outer edges of the branching electrodes 52a to 52d are equal. Each of the width-center lines SL11 to SL14 of the branching electrodes 52a to 52d crosses the center P11 of the surface signal electrode 52 and is shifted in parallel from the center P11 to left by the same distance.

As shown in FIG. 14A, the surface ground electrodes 53a to 53d are formed of conductive material such as metal. Each of the surface ground electrodes 53a to 53d is rectangular and has a predetermined width and a predetermined length. The distances from the centers P12 to P15 of the surface ground electrodes 53a to 53d to the center P11 of the surface signal electrode 52 are approximately equal. The width-center line SL15 of the surface ground electrode 53a is parallel to the width-center line SL11 of the branching electrode 52a. The width-center line SL16 of the surface ground electrode 53b is parallel to the width-center line SL12 of the branching electrode 52b. The width-center line SL17 of the surface ground electrode 53c is parallel to the width-center line SL13 of the branching electrode 52c. The width-center line SL18 of the surface ground electrode 53d is parallel to the width-center line SL14 of the branching electrode 52d. An outer edge of the branching electrode 52a, an outer side in the length direction of the surface ground electrode 53a, and an outer side in the width direction of the surface ground electrode 53b are almost colinear. An outer edge of the branching electrode 52b, an outer side in the length direction of the surface ground electrode 53b, and an outer side in the width direction of the surface ground electrode 53c are almost colinear. An outer edge of the branching electrode 52c, an outer side in the length direction of the surface ground electrode 53c, and an outer side in the width direction of the surface ground electrode 53d are almost colinear. An outer edge of the branching electrode 52d, an outer side in the length direction of the surface ground electrode 53d, and an outer side in the width direction of the surface ground electrode 53d are almost colinear. The distance between the surface ground electrode 53a and the branching electrode 52a, the distance between the surface ground electrode 53b and the branching electrode 52, the distance between the surface ground electrode 53c and the branching electrode 52c, and the distance between the surface ground electrode 53d and the branching electrode 52d are approximately equal. In addition, the distance between the surface ground electrode 53a and the branching electrode 52d, the distance between the surface ground electrode 53b and the branching electrode 52a, the distance between the surface ground electrode 53c and the branching electrode 52d, and the distance between the surface ground electrode 53d and the surface ground electrode 53d and the branching electrode 52c are approximately equal.

The throughhole 54 is cylindrical and is formed of conductive material such as metal. The throughhole 54 is formed through the board 51 under the center P11 of the surface signal electrode 52. The throughholes 55a to 55d are cylindrical and are formed of conductive material such as metal. The throughholes 55a to 55d are formed through the board 51 under the centers P12 to P15 of the surface ground electrodes 53a to 53d. Each of the throughholes 54 and 55a to 55d does not always need to be cylindrical, but may be cylindrically formed by forming a metal film on the inner wall of a throughhole. Also the positions of the throughholes 54 and 55a to 55d may be shifted from under the centers P11 to P15.

As shown in FIG. 14B, the reverse face signal electrode 56 is rectangular and is formed of conductive material such as metal. The reverse face signal electrode 56 is formed so that its center P16 approximately aligns with the center P11 of the surface signal electrode 52 in a reverse face view. The reverse face signal electrode 56 is in conduction with the surface signal electrode 52 through the throughhole 54.

As shown in FIG. 14B, the reverse face signal electrode 57 is rectangular and is formed of conductive material such as metal. The width of the reverse face signal electrode 57 is approximately equal to the width of each of the surface ground electrodes 53a to 53d. In the reverse face view, the outer edges of the reverse face signal electrode 57 approximately correspond to the outer sides in the width direction of the surface ground electrodes 53a to 53d, and the inner edges of the reverse face signal electrode 57 approximately correspond to the inner sides in the width direction of the surface ground electrodes 53a to 53d. The reverse face signal electrode 57 is in conduction with the surface ground electrodes 53a to 53d through the four throughholes 55a to 55d.

Eight capacitors C are mounted on the branching electrodes 52a to 52d of the surface signal electrode 32 and the surface ground electrodes 53a to 53d by soldering or the like. Specifically, among the eight capacitors C, two capacitors C each have one external electrode Cc connected to the surface signal electrode 52a and the other external electrode Cc connected to the surface ground electrode 53a when the two capacitors C are almost parallel to each other. Two other capacitors C each have one external electrode Cc connected to the branching electrode 52b and the other electrode Cc connected to the surface ground electrode 53b when two capacitors C are almost parallel to each other. Two other capacitors C each have one external electrode Cc connected to the branching electrode 52c and the other electrode Cc connected to the surface ground electrode 53c when two capacitors C are almost parallel to each other. Moreover, two other capacitors C each have one external electrode Cc connected to the branching electrode 52d and the other electrode Cc connected to the surface ground electrode 53d when two capacitors C are almost parallel to each other. In other words, the eight mounted capacitors C have a state in which they are connected in parallel, so that the directions of currents flowing in them are as indicated by the broken line arrows shown in FIG. 12.

More specifically, among the eight capacitors C, an angle formed by the current vectors of the top left pair of capacitors C in FIG. 12 and the bottom left pair of capacitors C in FIG. 12 is approximately 90 degrees. An angle formed by the bottom left pair of capacitors C in FIG. 12 and the bottom right pair of capacitors C in FIG. 12 is approximately 90 degrees. An angle formed by the bottom right pair of capacitors C in FIG. 12 and the top right pair of capacitors C in FIG. 12 is approximately 90 degrees. An angle formed by the top right pair of capacitors C in FIG. 12 and the top left pair of capacitors C is approximately 90 degrees. Right end faces in the length direction of the top left pair of capacitors C in FIG. 12 are directed almost in parallel to an outer portion of an inner side face of the top right pair of capacitors C, with a minute distance provided therebetween. Upper end faces in the length direction of the bottom left pair of capacitors C in FIG. 12 are directed in parallel to an outer portion of an inner side face of the top left pair of capacitors C, with a minute distance provided therebetween. Left end faces in the length direction of the bottom right pair of capacitors C in FIG. 12 are directed almost in parallel to an external portions of an inner side face of the bottom left pair of capacitors C, with a minute distance provided therebetween. Lower end faces in the length direction of the top right pair of capacitors C in FIG. 12 are directed in parallel to an outer portion of an inner side face of the bottom right pair of capacitors C, with a minute distance provided therebetween.

In the above capacitor mounting structure, the current vectors of each pair of adjacent capacitors C have an angle of approximately 90 degrees (ideally 90 degrees) therebetween. This minimizes the mutual inductance which can be generated between the adjacent capacitors C, thus reducing the ESL of the entire mounting structure.

In the above capacitor mounting structure, the branching electrodes 52*a* to 52*d* of the surface signal electrode 52 are positioned very close to the capacitors C. In addition, the width-center lines SL11 to SL14 of the branching electrodes 52*a* to 52*d* are positioned almost in parallel to the current vectors of the capacitors C. The branching electrodes 32*a* to 32*d* serve to reduce inductance by blocking magnetic flux generated when currents flow in the capacitors C. Thus, the ESL of the entire mounting structure can be considerably reduced. Obviously, one external electrode Cc of one adjacent capacitor C, which is directed to the inner side face of each capacitor C, can also have an inductance reducing operation as described above.

FIG. 15 shows a comparative example in which eight capacitors C are radially arranged by using the idea of the capacitor mounting structure shown in FIG. 3. In this example, currents flow in the radially arranged capacitors C in the same direction (indicated by the broken line arrows shown in FIG. 15), and an angle formed by the current vectors of each pair of capacitors C is set to approximately 45 degrees.

In the case of using capacitors each being of the type "0603" and having a total capacitance of 1 $\mu$F are used as the capacitors C in the mounting structures shown in FIGS. 12 and 15, as indicated by the changes D2 and D3 in the graph shown in FIG. 7, in the capacitor mounting structure shown in FIG. 12, the ESL is reduced over the measured frequency range compared with the capacitor mounting structure shown in FIG. 15.

In the above capacitor mounting structure, there is not a sector-form dead-space region between two pairs of capacitors C as in the capacitor mounting structure shown in FIG. 15. In addition, eight capacitors C can be close arranged so that the outline of the arrangement is almost rectangular. Thus, the mounting area is roughly represented by [Length of Capacitor C+{Width of Capacitor C×2}+α(Minute Gap Between Capacitors C)]².

Specifically, in the case of forming the capacitor mounting structure shown in FIG. 15 by using "0603" capacitors C, the minimum mounting area is approximately 3.0 mm². In addition, in the case of forming the capacitor mounting structure shown in FIG. 12 by using "0603" capacitors C, the minimum mounting area is approximately 2.3 mm². Accordingly, the capacitor mounting structure in FIG. 12 enables an approximately 23-percent reduction of mounting area compared with the capacitor mounting structure in FIG. 15.

Therefore, in the case of mounting a large number of capacitors C, by arranging in parallel capacitor mounting structures as shown in FIG. 12, dead-space regions are prevented from increasing in accordance with an increase in number of capacitor mounting structures as shown in FIG. 12. This satisfies demands for increased packaging density by reducing the required mounting area.

Moreover, by forming an electrode pattern based on the capacitor mounting structure on a board in a predetermined arrangement, a capacitor-mounted board on which a plurality of capacitor mounting structures as described above are arranged in parallel can be obtained.

Figure 16:
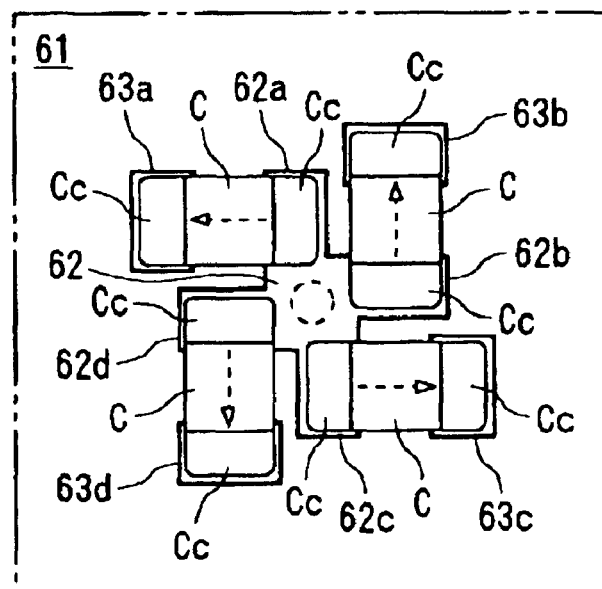
FIG. 16 is a plan view showing the surface of still another example of the capacitor mounting structure to which the present invention is applied.

FIG. 16 is a plan view showing another example of the capacitor mounting structure to which the present invention is applied. FIG. 17A is a plan view showing a surface signal electrode and surface ground electrodes in the capacitor mounting structure shown in FIG. 16, and FIG. 17B is a plan view showing a reverse face signal electrode and reverse face ground electrodes in the capacitor mounting structure shown in FIG. 16.

This capacitor mounting structure differs from that shown in FIG. 4 in that the positions of surface ground electrodes 63*a* to 63*d* are slightly shifted outward for mounting four capacitors C so that one end face in the length direction of one capacitor C is directed almost in parallel to a center portion of an inner side face of another capacitor C, with a minute distance provided therebetween, and in that the positions of branching electrodes 62*a* to 62*d* of the surface signal electrode 62 are shifted to left in parallel correspondingly to the positions of the surface ground electrodes 63*a* to 63*d*. The configuration of throughholes 64 and 65*a* to 65*d*, a reverse face signal electrode 66, and a reverse face ground electrode 67 is nearly or substantially identical to that in the capacitor mounting structure shown in FIG. 4.

In this capacitor mounting structure, the mounting area is increased since the positions of the surface ground electrodes 63*a* to 63*d* are slightly shifted outward. However, the mounting area is smaller than that in the capacitor mounting structure shown in FIG. 3. Therefore, for mounting many capacitors C, by arranging in parallel a plurality of capacitor mounting structures as shown in FIG. 16, dead-space regions are prevented from increasing as the number of capacitor mounting structures as shown in FIG. 16 increases. This consequently reduces the required mounting area, thus satisfying demands for increased packaging density. Regarding other points, operation and advantages similar to those of the capacitor mounting structure in FIG. 4 can be obtained. In addition, by forming, on a board, in a predetermined arrangement, an electrode pattern based on the above capacitor mounting structure, and mounting capacitors C on the board, a capacitor-mounted board on which the capacitor mounting structures are arranged in parallel can be obtained.

Figure 19:
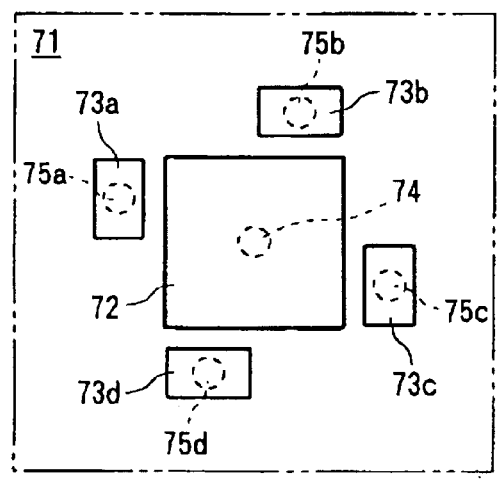
FIG. 19A is a plan view showing a surface signal electrode and surface ground electrodes in the capacitor mounting structure shown in FIG. 18.
FIG. 19B is a plan view showing a reverse face signal electrode and a reverse face ground electrode.
Figure 19:
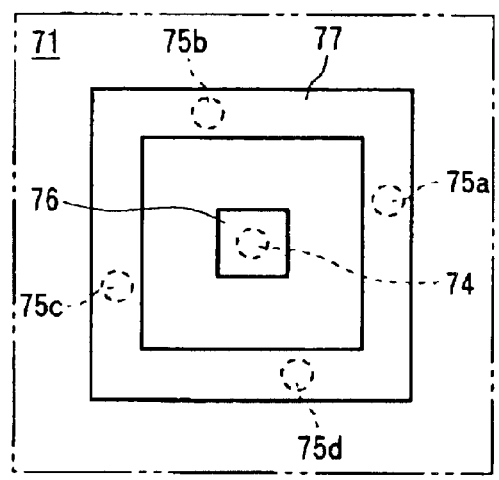

FIG. 18 is a plan view showing the surface of another example of the capacitor mounting structure to which the present invention is applied. FIG. 19A is a plan view showing a surface signal electrode and surface ground electrodes in the capacitor mounting structure shown in FIG. 18, and FIG. 19B is a plan view showing a reverse face signal electrode and a reverse face ground electrode.

This capacitor mounting structure differs from that shown in FIG. 4 in that the positions of surface ground electrodes 73*a* to 73*d* are slightly shifted outward for mounting four capacitors C so that one end face of one capacitor C in the length direction is directed almost in parallel to an inner portion of an inner side face of an adjacent capacitor C, with a minute distance provided therebetween, and that a rectangular electrode is employed as a surface signal electrode 72 correspondingly to the positions of the surface ground electrodes 73a to 73d. The configuration of throughholes 74 and 75a to 75d, a reverse face signal electrode 74, and a reverse face ground electrode 77 is nearly or substantially identical to that in the capacitor mounting structure shown in FIG. 4.

In this capacitor mounting structure, the mounting area is increased since the positions of the surface ground electrodes 73a to 73d are slightly shifted outward. However, the mounting area is smaller than that in the capacitor mounting structure shown in FIG. 3. Therefore, for mounting many capacitors C, by arranging in parallel a plurality of capacitor mounting structures as shown in FIG. 18, dead-space regions are prevented from increasing as the number of capacitor mounting structures as shown in FIG. 18. This consequently reduces the required mounting area, thus satisfying demands for increased packaging density. Regarding other points, operation and advantages similar to those of the capacitor mounting structure in FIG. 4 can be obtained. In addition, by forming, on a board, in a predetermined arrangement, an electrode pattern based on the above capacitor mounting structure, and mounting capacitors C on the board, a capacitor-mounted board on which the capacitor mounting structures are arranged in parallel can be obtained.

Figure 20:
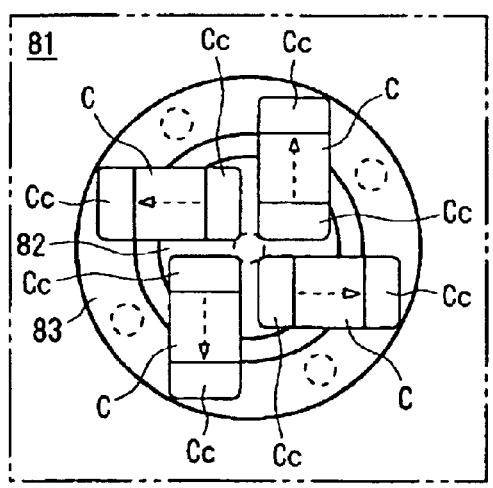
FIG. 20 is a plan view showing the surface of another example of the capacitor mounting structure to which the present invention is applied.

FIG. 20 is a plan view showing the surface of another example of the capacitor mounting structure to which the present invention is applied. FIG. 21A is a plan view showing a surface signal electrode and surface ground electrodes in the capacitor mounting structure shown in FIG. 20, and FIG. 21B is a plan view showing a reverse face signal electrode and a reverse face ground electrode.

This capacitor mounting structure differs from that shown in FIG. 4 in that a ring electrode is employed as a surface ground electrode 83 for mounting four capacitors C so that one end face of one capacitor C in the length direction is directed almost in parallel to an inner portion of an inner side face of an adjacent capacitor C, with a minute distance provided therebetween, that a circular surface signal electrode 82 is disposed inside the surface ground electrode 83, that a circular reverse face signal electrode 86 having a diameter smaller than that of the surface signal electrode 82 is provided on the reverse face of a board 81 and is connected to the surface signal electrode 82 by the throughhole 84, and that a reverse face ground electrode 87 which is almost identical in shape to the surface ground electrode 83 is provided on the reverse face of the board 81 and is connected to the surface ground electrode 83 by four throughholes 85.

Although this capacitor mounting structure has a slightly increased mounting area since the surface ground electrode 83 is ring-shaped, the mounting area is smaller than that in the capacitor mounting structure shown in FIG. 3. Therefore, for mounting many capacitors C, by arranging in parallel a plurality of capacitor mounting structures as shown in FIG. 20, dead-space regions are prevented from increasing as the number of capacitor mounting structures as shown in FIG. 20. This consequently reduces the required mounting area, thus satisfying demands for increased packaging density. Regarding other points, operation and advantages similar to those of the capacitor mounting structure in FIG. 4 can be obtained. In addition, by forming, on a board, in a predetermined arrangement, an electrode pattern based on the above capacitor mounting structure, and mounting capacitors C on the board, a capacitor-mounted board on which the capacitor mounting structures are arranged in parallel can be obtained.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A capacitor mounting structure comprising:

four or multiples-of-four capacitors whose quantity is represented by N times four, where N is an integer of 1 or greater (N≧1), said N times four capacitors each having external electrodes at ends in the respective length directions and each being parallelepiped in a rectangle; and signal electrodes and ground electrodes to which said N times four capacitors are respectively connected in parallel, wherein:

among said N times four capacitors, a first group of the capacitors, which is a first quarter of the capacitors, is provided in a predetermined direction, a second group of the capacitors, which is a second quarter of the capacitors, is provided wherein an angle formed by a current vector of said second group of the capacitors and a current vector of said first group of the capacitors is nearly or substantially 90 degrees, a third group of capacitors, which is a third quarter of the capacitors, is provided wherein an angle formed by a current vector of said third group of the capacitors and a current vector of said second group of the capacitors is nearly or substantially 90 degrees, and a fourth group of capacitors, which is a fourth quarter of the capacitors, is provided wherein an angle formed by a current vector of said fourth group of the capacitors and a current vector of said third group of the capacitors is nearly or substantially 90 degrees; and one end face of said first group of the capacitors in the length direction thereof is nearly or substantially parallel to an inner side face of said fourth group of the capacitors, one end face of said second group of the capacitors in the length direction thereof is nearly or substantially parallel to an inner side face of said first group of the capacitors, one end face of said third group of the capacitors in the length direction thereof is nearly or substantially parallel to an inner side face of said second group of the capacitors, and one end face of said fourth group of the capacitors in the length direction thereof is nearly or substantially parallel to an inner side face of said third group of the capacitors.

2. The capacitor mounting structure according to claim 1, wherein N is one.

3. The capacitor mounting structure according to claim 1, wherein:

N is 2; and each of the first to fourth groups of the capacitors comprises a pair of two capacitors having nearly or substantially parallel current vectors.

4. The capacitor mounting structure according to claim 1, wherein the outline of the arrangement of said N times four capacitors is nearly or substantially rectangular.

5. A capacitor-mounted board comprising a plurality of the capacitor mounting structures as set forth in claim 1, the capacitor mounting structures being arranged in parallel.

6. The capacitor-mounted board according to claim 5, wherein the capacitor mounting structures are arranged in a matrix composed of M rows and L columns, where one of M or L is an integer of 1 or greater, and the other one is an integer of 2 or greater.

7. A wiring board for use in capacitor mounting, the wiring board having combinations of signal electrodes and ground electrodes to which four or multiples-of-four capacitors whose quantity is represented by N times four, where N represents an integer of 1 or greater (N≧1), are connectable in parallel, said N times four capacitors each having external electrodes at ends in the respective length directions and each being parallelepiped in a rectangle, said signal electrodes and said ground electrodes being arranged wherein:

among said N times four capacitors, a first group of the capacitors, which is a first quarter of the capacitors, is provided in a predetermined direction; a second group of the capacitors, which is a second quarter of the capacitors, is provided wherein an angle formed by a current vector of said second group of the capacitors and a current vector of said first group of the capacitors is nearly or substantially 90 degrees; a third group of the capacitors, which is a third quarter of the capacitors, is provided wherein an angle formed by a current vector of said third group of the capacitors and a current vector of said second group of the capacitors is nearly or substantially 90 degrees; and a fourth group of the capacitors, which is a fourth quarter of the capacitors, is provided wherein an angle formed by a current vector of said fourth group of the capacitors and a current vector of said third group of the capacitors is nearly or substantially 90 degrees; and one end face of said first group of the capacitors in the length direction thereof is nearly or substantially parallel to an inner side face of said fourth group of the capacitors, one end face of said second group of the capacitors in the length direction thereof is nearly or substantially parallel to an inner side face of said first group of the capacitors, one end face of said third group of the capacitors in the length direction thereof is nearly or substantially parallel to an inner side face of said second group of the capacitors, and one end face of said fourth group of the capacitors in the length direction thereof is nearly or substantially parallel to an inner side face of said third group of the capacitors.

8. The wiring board according to claim 7, wherein the combinations of signal electrodes and ground electrodes are arranged in a matrix composed of M rows and L columns, where one of M or L is an integer of 1 or greater, and the other one is an integer of 2 or greater.

9. A capacitor-mounting structure comprising:

four or multiples-of-four capacitors whose quantity is represented by N times four, where N is an integer of 1 or greater (N≧1), said N times four capacitors each having external electrodes at ends in the respective length directions and each being parallelepiped in a rectangle; and signal electrodes and ground electrodes to which said N times four capacitors are respectively connected in parallel, said N times four capacitors being comprised of a first group, a second group, a third group, and a fourth group, each group having an inner end face, an outer end face, an inner side face, and an outer side face with respect to its length direction, wherein an angle formed by a current vector of said second group and a current vector of said first group, an angle formed by a current vector of said third group and a current vector of said second group, and an angle formed by a current vector of said fourth group and a current vector of said third group are nearly or substantially 90 degrees, and wherein the inner end face of the first group faces the inner side face of the fourth group, the inner end face of the fourth group faces the inner side face of the third group, the inner end face of the third group faces the inner side face of the second group, and the inner end face of the second group faces the inner side face of the first group.

10. The capacitor-mounting structure according to claim 9, wherein the inner end face of the first group is nearly or substantially parallel to the inner side face of the fourth group, the inner end face of the fourth group is nearly or substantially parallel to the inner side face of the third group, the inner end face of the third group is nearly or substantially parallel to the inner side face of the second group, and the inner end face of the second group is nearly or substantially parallel to the inner side face of the first group.

11. The capacitor-mounting structure according to claim 10, wherein the outer side face of the first group is nearly or substantially aligned with the outer end face of the fourth group, the outer side face of the fourth group is nearly or substantially aligned with the outer end face of the third group, the outer side face of the third group is nearly or substantially aligned with the outer end face of the second group, the outer side face of the second group is nearly or substantially aligned with the outer end face of the first group.

12. The capacitor-mounting structure according to claim 10, wherein the inner end face of the first group is nearly or substantially aligned with the inner side face of the fourth group, the inner end face of the fourth group is nearly or substantially aligned with the inner side face of the third group, the inner end face of the third group is nearly or substantially aligned with the inner side face of the second group, the inner end face of the second group is nearly or substantially aligned with the inner side face of the first group.

13. The capacitor-mounting structure according to claim 9, wherein N is one.

14. The capacitor-mounting structure according to claim 9, wherein N is 2, and each group is comprised of a pair of capacitors.

15. The capacitor-mounting structure according to claim 9, wherein said N times four capacitors are arranged nearly or substantially in a square.

16. The capacitor-mounting structure according to claim 9, wherein the signal electrodes connected to the N times four capacitors are integrated in nearly or substantially an X shape on a board on which the N times four capacitors are mounted.

17. The capacitor-mounting structure according to claim 16, wherein the ground electrodes connected to the N times four capacitors are integrated in nearly or substantially a quadrilateral shape on a reverse side of the board.

18. The capacitor-mounting structure according to claim 9, wherein the signal electrodes connected to the N times four capacitors are integrated in nearly or substantially a circular shape on a board on which the N times four capacitors are mounted.

19. The capacitor-mounting structure according to claim 18, wherein the ground electrodes connected to the N times four capacitors are integrated in nearly or substantially a ring shape on the board.

20. A capacitor-mounted board comprising a board and a plurality of the capacitor-mounting structures as set forth in claim 9 mounted on the board, the capacitor mounting structures being arranged in parallel.

* * * * *